Jan. 28, 1947. A. ALVIRA Re. 22,834

FREQUENCY MODULATION SYSTEM

Original Filed Aug. 17, 1942

Inventor:
Alfonso Alvira,
by Harry E. Dunham
His Attorney.

Reissued Jan. 28, 1947

Re. 22,834

UNITED STATES PATENT OFFICE 22,834

FREQUENCY MODULATION SYSTEM

Alfonso Alvira, Schenectady, N. Y., assignor to General Electric Company, a corporation of New York Original No. 2,339,608, dated January 18, 1944, Serial No. 455,016, August 17, 1942. Application for reissue September 16, 1944, Serial No. 554,446.

7 Claims. (Cl. 179—171.5)

My invention relates to frequency modulated transmitting equipment in which the average frequency of the equipment can be varied over a substantial range, and more particularly, to a system of frequency modulation for such equipment.

An object of my invention is to provide a method of frequency modulation in which the modulating effect is held substantially constant over the entire frequency range of the transmitting equipment.

In frequency modulated transmitting equipment, it is a well known practice to vary the frequency of a master oscillator circuit in accordance with the amplitude of modulating signals by means of a reactance circuit. This reactance circuit may comprise an electron discharge device with associated circuits which, in effect, acts like a variable reactance across the master oscillator tuned circuit, thus altering the frequency at a desired rate. The magnitude of the frequency variation is dependent upon the ratio of the effective reactance of the reactance circuit to that of the master oscillator tuned circuit elements. In frequency modulated transmitting equipment, where the average frequency of the equipment is variable over a substantial range of frequencies, it is undesirable to have the modulating effect of the reactance circuit vary widely with adjustment of the frequency of the master oscillator circuit. It is a further object of my invention therefore, to provide a modulating system for frequency modulated transmitting equipment which permits the effect of a reactance circuit to be held substantially constant at all adjustments of the frequency of the master oscillator tuned circuit and to maintain a substantially constant amount of modulation over the entire frequency range of the master oscillator.

The features of my invention which I believe to be novel are set forth with particularity in the appended claims. My invention itself, however, together with further objects and advantages thereof, may best be understood by reference to the following description taken in connection with the accompanying drawing, in which Fig. 1 shows the modulation circuit of a frequency modulated transmitter embodying certain features of my invention and Fig. 2 is a modification of the circuit of Fig. 1 embodying other features of the invention.

Figure 1:
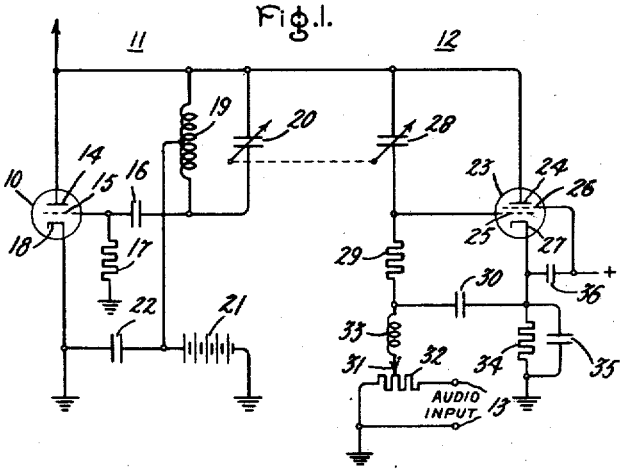
Figure 2:
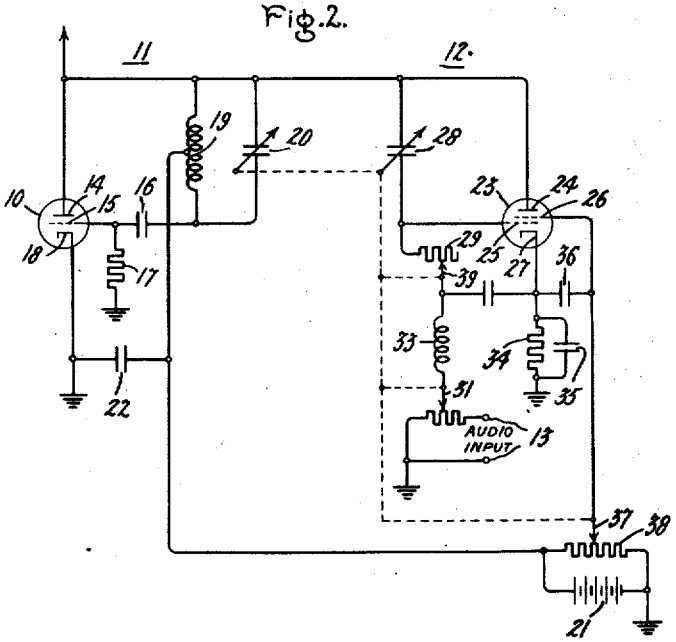

In Fig. 1 the electron discharge device 10 acts as a source of high frequency oscillations, the average frequency of which is controlled by the resonant frequency determining circuit 11. Modulation of oscillations from the device 10 is effected by means of the reactance circuit 12, including the source of modulating signals 13.

As shown, device 10 has an anode 14 connected directly to one terminal of the resonant frequency determining circuit 11, a control electrode 15 coupled by means of capacitor 16 to the other terminal of the resonant frequency determining circuit 11 and connected by means of resistance 17 to ground, and a cathode 18 connected directly to ground. The resonant frequency determining circuit 11 comprises an inductance 19 and a variable capacitor 20. A tap on inductance 19 is connected to a source of potential, such as a battery 21, and coupled by means of a condenser 22 to the cathode 18. While I have shown capacitor 20 as a single capacitor, it is of course understood that a plurality of capacitors of the same or of varying size and connected in parallel may be used. In fact, any arrangement may be used which allows the average frequency of the resonant circuit 11 to be varied over a wide range, for example, from two megacycles to four megacycles.

The reactance circuit 12 comprises an electron discharge device 23 having an anode 24, control electrodes 25 and 26, and a cathode 27. For a purpose to be explained later, variable capacitor 28 is connected between anode 24 and control electrode 25. Anode 24, of the modulating device 23 may be connected to either terminal of the resonant frequency determining circuit 11; in the figures of the drawing it is shown as connected to the terminal to which the anode 14 is connected. Control electrode 25 is connected, by means of resistor 29 and bypass condenser 30 to the cathode of device 23, and by means of resistor 29 and arm 31 to a variable point on resistor 32 connected to ground. In this circuit inductance 33 is inserted to act as a radio frequency choke. Modulating signals, such as from an audio source 13, are connected across resistor 32 and supplied with variable intensity by means of arm 31 to control electrode 25. As shown, cathode 27 is connected to ground through resistor 34, resistor 34 being bypassed by capacitor 35. For a purpose to be explained later, capacitors 20 and 28 are shown as arranged for simultaneous operation. Thus, they may be either mounted on the same shaft or otherwise mechanically linked. In order to prevent oscillations of device 23, control electrode 26, bypassed for alternating currents to cathode 27 by means of capacitor 36, is connected to a source of positive potential in a well known manner to act as the usual screen grid.

In the operation of my frequency modulation system, oscillations of an average frequency determined by the capacitance of capacitor 20 in the resonant frequency determining circuit 11 are generated in the anode circuit of device 10. These oscillations are caused to vary in accordance with the frequency of the modulating signals from the source 13 by means of the reactance circuit 12. This circuit, comprising the device 23 and its associated reactance elements, functions as a variable capacitance across the tuned circuit 11 in accordance with signals from the audio source 13. Proper selection of the values of capacitor 28 between the anode and control electrode and the resistor 29 between the control electrode and cathode of the modulating device 23 results in shifting the phase of the modulator anode current so that it is substantially 90° out of phase with the anode current of the oscillator 10. Thus, the modulator functions as a capacitance connected across the frequency determining circuit of the oscillator and modulates the frequency of the oscillations in accordance with the instantaneous intensity of signals, the rate of variation of the frequency of the oscillations corresponding to rate of variation of the instantaneous intensity of the signals, i. e., the frequency of the signals varying in accordance with the voltage impressed on control electrode 25. Therefore, when an audio frequency signal is applied to control electrode 25 of modulator 23, the oscillator is subjected to the effect of a varying capacitance across the frequency determining circuit 11, causing the oscillator frequencies to swing above and below the mean carrier frequency at the rate determined by the applied audio frequency. The magnitude of frequency variation is dependent upon the ratio of the effective capacitance of the reactance circuit 12 to that of the master oscillator tuned circuit.

In order that the effect of the reactance circuit remain constant for different values of the capacity of variable master oscillator capacitor 20, capacitor 28 in the reactance circuit is mechanically coupled with capacitor 20 for simultaneous variation of capacity therewith. In this manner the ratio of the effective capacitance of the reactance circuit to that of the oscillator tuned circuit may be maintained virtually constant; hence the magnitude of frequency variations of the oscillations, i. e., the amount of modulation, is maintained substantially constant. By properly proportioning capacitor 28 and resistor 29 with respect to capacitor 20, the reactance circuit 12 may be designed for all values of capacity of the capacitor 20 and for a predetermined intensity of audio signal to produce a constant modulation of the oscillations in the anode circuit of the device 10.

In the portion of the transmitter circuit shown in Fig. 2, control electrode 26 of device 23 is supplied with a unidirectional potential by the variable contact arm 37 on potentiometer 38 connected across battery 21. In this modification, the effective value of resistor 29 in the reactance circuit 12 is determined by the position of the variable contact arm 39. As shown on the drawing, capacitors 20 and 28 and contact arms 31, 37, and 39 are mechanically linked together for unicontrolled operation. As explained later, the number of these elements so unicontrolled may be chosen to meet given operating conditions.

As previously explained, variation of the value of either capacitor 28 or resistor 29 changes the apparent reactance of the reactance circuit 12. Hence, the amount of modulation may be controlled by variation of either of these parameters. Adjustment of the contact arm 31 affects the intensity of the signals supplied to the control electrode of modulator 23 and changes the modulating effect of the device 23. Adjustment of this parameter then provides a third means for controlling the amount of modulation as the average frequency of oscillations is adjusted by variation of capacitor 20 in the resonant frequency determining circuit. Variation of a fourth parameter, the potential applied to the control electrode 26, alters the trans-conductance of the device 23 and its effect on the reactance circuit. In practical application any, or all, of these variables may be linked with the capacitor 20. The particular ones to be so unicontrolled depends upon both the range of the average frequency of the oscillations of the device 10 and the amount of modulation desired.

It will thus be seen that I have provided a frequency modulating system which permits the effect of the reactance circuit 12 to be held approximately constant for all adjustments of the variable capacitor 20 in the resonant frequency determining circuit of the master oscillator, thus keeping the modulation effect substantially constant over the entire frequency range of the master oscillator.

While I have shown particular embodiments of my invention, it will of course be understood that I do not wish to be limited thereto since various modifications may be made, and I contemplate by the appended claims to cover any such modifications as fall within the true spirit and scope of my invention.

What I claim as new and desire to secure by Letters Patent of the United States is:

1. A frequency modulated transmitting system comprising a source of oscillations including a resonant frequency determining circuit, means for varying the average frequency of said oscillations, means for frequency-modulating said oscillations comprising an electron discharge device having an anode connected with said resonant circuit, a cathode, and a control electrode, means for connecting modulating signals between said control electrode and said cathode, a variable reactance connected between said control electrode and said anode, and means for simultaneously varying said reactance as said frequency varying means is varied, whereby the amount of frequency modulation caused by said modulating means is maintained substantially constant as said average frequency is varied over a substantial range.

2. In combination, a source of oscillations including a resonant frequency determining circuit, means for varying the average frequency of said oscillations, means for modulating said oscillations comprising an electron discharge device connected in shunt with said frequency determining circuit, and means linked with said frequency varying means for adjusting the conductance of said device as said frequency varying means is varied, said frequency varying means and said conductance adjusting means being so proportioned that the modulating effect of said modulating means is maintained substantially constant as said average frequency is varied over a substantial range.

3. A frequency modulated transmitting system comprising a source of oscillations including a resonant frequency determining circuit, means for varying the average frequency of said oscillations, means for frequency modulating said oscillations comprising an electron discharge device having an anode connected with said resonant circuit, a cathode, and a control electrode, a variable reactance connected between said control electrode and said anode, means for connecting modulating signals between said control electrode and said cathode, means for varying the intensity of said signals, and means for simultaneously adjusting said intensity varying means as said frequency varying means is adjusted, said intensity varying means and said frequency varying means being so proportioned that the amount of frequency modulation caused by said modulating means is maintained substantially constant as said average frequency is varied over a substantial range.

4. In a radio transmitter, the combination of a source of oscillations, means for varying the average frequency of said oscillations, means for modulating a characteristic of said oscillations comprising a reactance circuit connected to provide an effective capacitance connected in shunt with said frequency varying means, and means connected to said circuit and arranged for maintaining the ratio of the effective capacitance of said reactance circuit to the effective capacitance of said frequency varying means substantially constant as said average frequency is varied over a substantial range.

5. In a radio transmitter the combination of, a source of oscillations, means for modulating a characteristic of said oscillations, means for controlling the amount of said modulation, means for varying the average frequency of said oscillations, said controlling means being mechanically connected with said frequency varying means for simultaneous adjustment therewith to maintain the amount of said modulation substantially constant as said average frequency is varied over a substantial range.

6. In a radio transmitter the combination of, a source of oscillations including a resonant frequency determining circuit, means for modulating the frequency of said oscillations comprising a reactance circuit connected in shunt with said resonant circuit, said reactance circuit including a variable impedance, adjustable means for varying the frequency of said resonant circuit, and means interconnecting said frequency varying means and said impedance for simultaneously varying the impedance of said reactance circuit as said frequency varying means is adjusted thereby to maintain the amount of modulation substantially constant as said frequency varies over a substantial range.

7. In combination, a source of oscillations including a resonant frequency determining circuit, means for varying the average frequency of said oscillations, means for frequency-modulating said oscillations comprising a reactance circuit connected with said frequency determining circuit, means for varying the apparent reactance of said reactance circuit presented to said frequency determining circuit, and means interconnecting said frequency varying means and said reactance varying means for maintaining the amount of frequency modulation substantially constant as said average frequency is varied over a substantial range.

ALFONSO ALVIRA.

Disclaimer

Re. 22,834.—*Alfonso Alvira*, Schenectady, N. Y. FREQUENCY MODULATION SYSTEM. Patent dated Jan. 28, 1947. Disclaimer filed May 11, 1950, by the assignee, *General Electric Corporation*.

Hereby enters this disclaimer of claims 5, 6, and 7 of said patent.

[*Official Gazette June 13, 1950.*]